(12) United States Patent
Fukushima

(10) Patent No.: US 10,766,076 B2
(45) Date of Patent: Sep. 8, 2020

(54) COATED CUTTING TOOL

(71) Applicant: TUNGALOY CORPORATION, Fukushima (JP)

(72) Inventor: Naoyuki Fukushima, Iwaki (JP)

(73) Assignee: TUNGALOY CORPORATION, Iwaki-shi, Fukushima (JP)

( * ) Notice: Subject to any disclaimer, the term of this patent is extended or adjusted under 35 U.S.C. 154(b) by 0 days.

(21) Appl. No.: 16/401,674

(22) Filed: May 2, 2019

(65) Prior Publication Data
US 2019/0344357 A1  Nov. 14, 2019

(30) Foreign Application Priority Data
May 9, 2018  (JP) .................. 2018-090738

(51) Int. Cl.
  *C04B 35/56*  (2006.01)
  *C22C 29/06*  (2006.01)
  (Continued)

(52) U.S. Cl.
  CPC ........ *B23B 27/148* (2013.01); *C04B 35/5626* (2013.01); *C04B 41/009* (2013.01); *C04B 41/5031* (2013.01); *C04B 41/5068* (2013.01); *C04B 41/87* (2013.01); *C22C 29/067* (2013.01); *C22C 29/08* (2013.01); *C23C 16/0227* (2013.01); *C23C 16/308* (2013.01); *C23C 16/34* (2013.01); *C23C 16/36* (2013.01); *C23C 16/403* (2013.01); *B23B 2222/28* (2013.01); *C04B 2235/3839* (2013.01); *C04B 2235/3843* (2013.01); *C04B 2235/3847* (2013.01);
  (Continued)

(58) Field of Classification Search
  CPC .................................. B23B 27/148
  USPC .......................................... 428/698
  See application file for complete search history.

(56) References Cited

U.S. PATENT DOCUMENTS
2019/0010606 A1  1/2019  Kubo

FOREIGN PATENT DOCUMENTS
JP   2015101747 A  *  6/2015
WO   2017/038762 A1   3/2017
WO   WO-2017057266 A1 * 4/2017 ............. B23B 51/00

OTHER PUBLICATIONS

Matsushita et al., WO 2017/057266 A1, machine translation, Apr. 6, 2017, entire machine translation (Year: 2017).*

(Continued)

*Primary Examiner* — Humera N. Sheikh
*Assistant Examiner* — Katherine A Christy
(74) *Attorney, Agent, or Firm* — Studebaker & Brackett PC

(57) ABSTRACT

A coated cutting tool comprising a cemented carbide and a coating layer formed on a surface of the cemented carbide, wherein:
  an average thickness of the coating layer is from 5.0 μm or more to 30.0 μm or less; and
  in the cemented carbide, when regarding a region thereof which ranges from the surface of the cemented carbide to a depth of 20.0 μm in a direction opposite to the coating layer as a surface region, and also regarding a region thereof on a side opposite to the coating layer across the surface region as an inner region, an average value of KAM values in the surface region $KAM_s$ and an average value of KAM values in the inner region $KAM_i$ satisfy a condition represented by formula (1) below.

$$0.00° \leq |KAM_s - KAM_i| \leq 0.10° \quad (1)$$

20 Claims, 1 Drawing Sheet

(51) Int. Cl.
  *C22C 29/08*  (2006.01)
  *B23B 27/14*  (2006.01)
  *C04B 41/00*  (2006.01)
  *C04B 41/50*  (2006.01)
  *C04B 41/87*  (2006.01)
  *C23C 16/02*  (2006.01)
  *C23C 16/30*  (2006.01)
  *C23C 16/34*  (2006.01)
  *C23C 16/36*  (2006.01)
  *C23C 16/40*  (2006.01)

(52) U.S. Cl.
  CPC ................. *C04B 2235/3856* (2013.01); *C04B 2235/3886* (2013.01); *C04B 2235/405* (2013.01)

(56) References Cited

OTHER PUBLICATIONS

Yamamoto et al., JP 2015101747 A, machine translation, Jun. 4, 2015, entire machine translation (Year: 2015).*

* cited by examiner

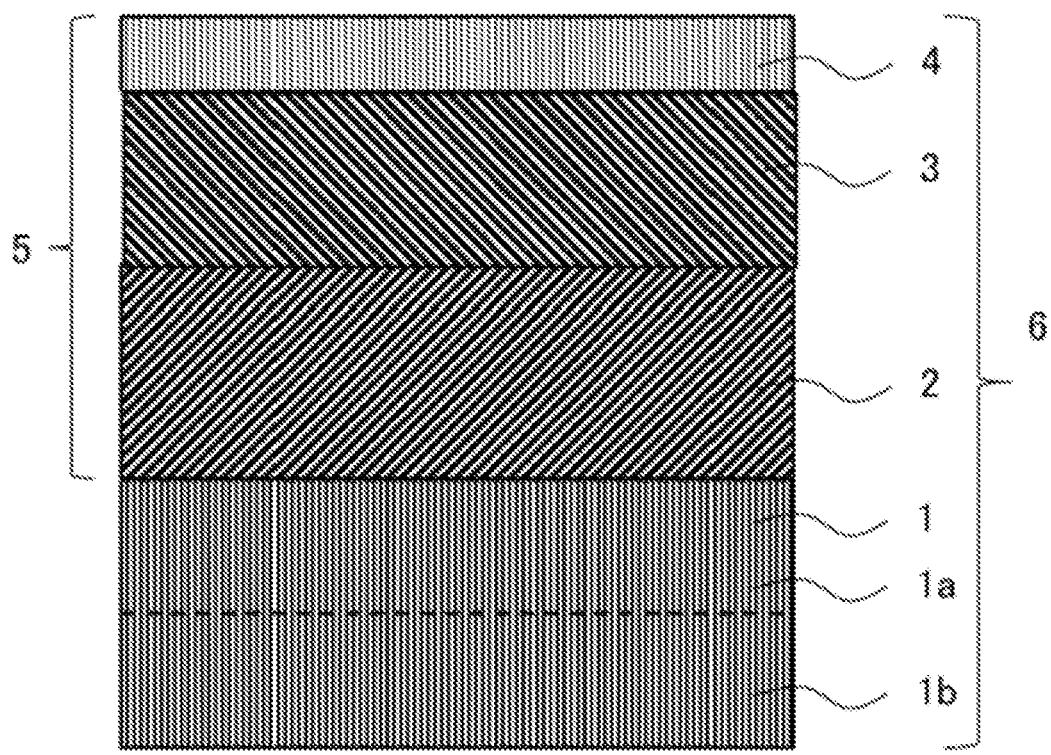

COATED CUTTING TOOL

TECHNICAL FIELD

The present invention relates to a coated cutting tool.

BACKGROUND ART

It has been conventionally well known to employ, for the cutting of steel, cast iron, etc., a coated cutting tool which is obtained by depositing, via chemical vapor deposition, a coating layer with a total thickness of from 3 μm or more to 20 μm or less on a surface of a substrate consisting of a cemented carbide. A known example of the above coating layer is a coating layer consisting of a single layer of one kind selected from the group consisting of a Ti carbide, a Ti nitride, a Ti carbonitride, a Ti carboxide, a Ti carboxynitride, and aluminum oxide, or consisting of multiple layers of two or more kinds selected therefrom.

For example, Patent Document 1 proposes a coated tool comprising a substrate consisting of a cemented carbide and a coating layer located on a surface of the substrate, wherein: the coating layer is in contact with the substrate and includes a first layer containing $Ti(C_xN_{1-x})$ ($0 \le x \le 1$); and, as to the WC particles in a region of the substrate which ranges from the surface thereof to a depth of 5 μm, the KAM average value measured by an electron backscatter diffraction (EBSD) method with a scanning electron microscope equipped with an electron backscatter diffraction pattern system is 1° or less.

CITATION LIST

Patent Documents

Patent Document 1: WO2017/038762

SUMMARY

Technical Problem

An increase in speed, feed and depth of cut has become more conspicuous in cutting in recent times, and the chipping resistance and fracture resistance of a tool are required to be further improved compared to those involved in the prior art. In particular, a tool is required which has stable performance not involving the occurrence of sporadic fracturing even in the case of such tool being mass produced.

When depositing a coating layer on a surface of a cemented carbide via chemical vapor deposition, strain remains in a part of the cemented carbide which is near the surface thereof due to a large difference in the thermal expansion coefficient between the coating layer and the cemented carbide.

Further, the coated tool of Patent Document 1 only takes into consideration the KAM average value of a region of the substrate which ranges from the surface thereof to a depth of 5 μm. It is therefore considered that a large difference exists in the absolute value of the KAM value between a part of the substrate which is close to the surface and a part thereof which is distant from the surface. This can be inferred from the fact that the coating layer is formed by chemical vapor deposition.

The present invention has been made in light of the above circumstances, and an object of the present invention is to provide a coated cutting tool which has excellent chipping resistance and fracture resistance and which accordingly allows for an extended tool life.

Solution to Problem

The present inventor has conducted intensive studies in order to achieve the above object and has then found that, in a coated cutting tool, strain control performed on a part of a cemented carbide which is close to a surface thereof and an inner part of the cemented carbide allows the coated cutting tool to have excellent chipping resistance and fracture resistance, and this has led to the completion of the present invention.

Namely, the present invention is as set forth below:

[1] A coated cutting tool comprising a cemented carbide and a coating layer formed on a surface of the cemented carbide, wherein:

an average thickness of the coating layer is from 5.0 μm or more to 30.0 μm or less; and in the cemented carbide, when regarding a region thereof which ranges from the surface of the cemented carbide to a depth of 20.0 μm in a direction opposite to the coating layer as a surface region, and also regarding a region thereof on a side opposite to the coating layer across the surface region as an inner region, an average value of KAM values in the surface region and an average value of KAM values in the inner region satisfy a condition represented by formula (1) below.

$$0.00° \le |KAM_s - KAM_i| \le 0.10° \quad (1)$$

(In formula (1), $KAM_s$ denotes an average value of KAM values in the surface region, and $KAM_i$ denotes an average value of KAM values in the inner region.)

[2] The coated cutting tool of [1], wherein the $KAM_s$ is from 0.35° or more to 0.55° or less.

[3] The coated cutting tool of [1] or [2], wherein the $KAM_i$ is from 0.35° or more to 0.55° or less.

[4] The coated cutting tool of any of [1] to [3], wherein the cemented carbide comprises 5.0 mass % or more to 12.0 mass % or less of a binder phase.

[5] The coated cutting tool of any of [1] to [4], wherein:

the cemented carbide comprises a compound phase containing one or more kinds of a compound or compounds, each compound consisting of: an element of at least one kind selected from the group consisting of Ti, Zr, Hf, V, Nb, Ta, Cr and Mo; and an element of at least one kind selected from the group consisting of C, N, O and B; and the cemented carbide comprises 3.0 mass % or more to 6.0 mass % or less of the compound phase.

[6] The coated cutting tool of any of [1] to [5], wherein:

the coating layer comprises a lower layer and an upper layer formed on a surface of the lower layer in order from the cemented carbide side;

the lower layer has an average thickness of from 1.5 μm or more to 15.0 μm or less;

the lower layer is a Ti compound layer comprised of a layer of one kind selected from the group consisting of a Ti carbide layer, a Ti nitride layer, a Ti carbonitride layer, a Ti carboxide layer and a Ti carboxynitride layer, or comprised of layers of two or more kinds selected therefrom;

the upper layer has an average thickness of from 1.5 μm or more to 15.0 μm or less; and the upper layer is an α-type aluminum oxide layer comprised of α-type aluminum oxide.

Advantageous Effects of Invention

The present invention can provide a coated cutting tool which has excellent chipping resistance and fracture resistance and which accordingly allows for an extended tool life.

BRIEF DESCRIPTION OF DRAWINGS

The FIGURE is a schematic view showing an example of a coated cutting tool according to the present invention.

DESCRIPTION OF EMBODIMENTS

An embodiment for carrying out the present invention (hereinafter simply referred to as the "present embodiment") will hereinafter be described in detail, with reference to the attached drawings as appropriate. However, the present invention is not limited to the present embodiment below. Various modifications may be made to the present invention without departing from the gist of the invention. It should be noted that, in the drawings, the same elements are denoted by the same symbols and will not be further explained. Unless otherwise specified, positional relationships, such as vertical and horizontal relationships, are based on the positional relationships shown in the drawings. Further, the dimensional ratios of the drawings are not limited to those shown therein.

A coated cutting tool according to the present embodiment is a coated cutting tool comprising a cemented carbide and a coating layer formed on a surface of the cemented carbide, wherein: an average thickness of the coating layer is from 5.0 μm or more to 30.0 μm or less; and, in the cemented carbide, when regarding a region thereof which ranges from the surface of the cemented carbide to a depth of 20.0 μm in a direction opposite to the coating layer as a surface region, and also regarding a region thereof on a side opposite to the coating layer across the surface region as an inner region, an average value of KAM values in the surface region and an average value of KAM values in the inner region satisfy a condition represented by formula (1) below.

$$0.00° \leq |KAM_s - KAM_i| \leq 0.10° \quad (1)$$

(In formula (1), $KAM_s$ denotes an average value of KAM values in the surface region, and $KAM_i$ denotes an average value of KAM values in the inner region.)

The FIGURE is a schematic cross-sectional view showing an example of a coated cutting tool according to the present embodiment. A coated cutting tool 6 comprises a substrate 1 (cemented carbide) and a coating layer 5 formed on a surface of the substrate 1, and the substrate 1 consists of a surface region 1a and an inner region 1b. The coating layer 5 comprises: a lower layer 2 formed on the surface of the substrate 1; an upper layer 3 formed on a surface of the lower layer 2 which is located on a side opposite to the substrate 1; and an outermost layer 4 formed on a surface of the upper layer 3 which is located on a side opposite to the lower layer 2.

The coated cutting tool of the present embodiment has the configuration described above and thereby provides the following operational advantages. The operations can be considered to be as set forth below; however, they are not limited thereto.

With regard to the coated cutting tool of the present embodiment, in the cemented carbide serving as the substrate, if the absolute value of the difference between an average value of KAM values in the surface region and an average value of KAM values in the inner region is 0.10° or less, this leads to a reduced number of locations serving as starting points for the breakage of the coated cutting tool, which allows the load in a cutting process to be prone to be dispersed, thereby resulting in excellent fracture resistance.

A KAM value is a numerical value, in a crystal orientation analysis based on an electron backscatter diffraction (hereinafter referred to as "EBSD") method with the use of a scanning electron microscope, which indicates a local misorientation, being a crystal orientation difference between adjacent measurement points, and such KAM value is a parameter for evaluating plastic deformation in a quantitative manner. A greater KAM value refers to a greater crystal orientation difference between adjacent measurement points and, in turn, means greater plastic deformation. In the cemented carbide, if the absolute value of the difference between the average value of KAM values in the surface region and the average value of KAM values in the inner region is 0.10° or less, this leads to a small difference in the plastic deformation (strain) between the surface region and the inner region, and this can suppress, in the surface region, the generation of cracking due to the plastic deformation, and can also suppress, even if cracking is generated, the progress of such cracking. In other words, the toughness in the surface region of the cemented carbide is increased. Further, if the average thickness of the coating layer is 5.0 μm or more, this leads to an improvement of wear resistance because the function of the coating layer can be exerted in an effective and reliable manner. If the average thickness of the coating layer is 30.0 μm or less, this leads to an improvement in the adhesion of the coating layer with the cemented carbide as well as an improvement of fracture resistance. As a result, the coated cutting tool of the present embodiment has both excellent chipping resistance and fracture resistance, and in particular has excellent fracture resistance. The coated cutting tool of the present embodiment also has stable performance not involving the occurrence of sporadic fracturing even in the case of such tool being mass produced. However, the factors for the excellent chipping resistance and fracture resistance of the coated cutting tool of the present embodiment are not limited thereto.

(Substrate)

The coated cutting tool of the present embodiment comprises a cemented carbide, serving as a substrate, and a coating layer formed on a surface of the cemented carbide. Specific examples of types of such coated cutting tool include an indexable cutting insert for milling or turning, a drill and an end mill.

The substrate used for the coated cutting tool of the present embodiment is a cemented carbide. Since the substrate of the coated cutting tool of the present embodiment is a cemented carbide, such coated cutting tool has further excellent wear resistance and fracture resistance.

The cemented carbide satisfies a condition represented by formula (1) below.

$$0.00° \leq |KAM_s - KAM_i| \leq 0.10° \quad (1)$$

(In formula (1), $KAM_s$ denotes an average value of KAM values in the surface region, and $KAM_i$ denotes an average value of KAM values in the inner region.)

With regard to the coated cutting tool of the present embodiment, in the cemented carbide, if the absolute value of the difference between an average value of KAM values in the surface region and an average value of KAM values in the inner region is 0.10° or less, this allows the load in a cutting process to be prone to be dispersed, thereby resulting in excellent fracture resistance.

From the perspective of providing the above-described operational advantages in a more effective and reliable manner, in the cemented carbide, the absolute value of the difference between the average value of KAM values in the surface region and the average value of KAM values in the inner region is preferably 0.08° or less, is more preferably 0.06° or less, and is further preferably 0.04° or less. In the cemented carbide, if the absolute value of the difference between the average value of KAM values in the surface region and the average value of KAM values in the inner region falls under the range described above, this allows the load in a cutting process to be prone to be further dispersed, thereby resulting in further excellent fracture resistance.

Even when forming the coating layer by chemical vapor deposition, the absolute value of the difference between the average value of KAM values in the surface region and the average value of KAM values in the inner region in the cemented carbide can be adjusted by, for example, controlling the dry shot blasting conditions set forth below. More specifically, for example, in dry shot blasting, the above absolute value can be controlled so as to be from 0.00° or more to 0.10° or less by setting a shot angle at 90° and by adjusting a shot pressure so as to be from 1.7 bar or higher to 1.9 bar or lower, as well as adjusting the average particle size of a shot material so as to be from 120 μm or more to 150 μm or less (where the shot material is steel, from 380 μm or more to 420 μm or less).

KAM values and the average value thereof are measured as set forth below. A sample of a coated cutting tool is polished in a direction orthogonal to the surface of such sample so that a cross-sectional surface is exposed. With regard to a part of such cross-sectional surface which consists of the cemented carbide, a region of the cemented carbide which ranges from the surface thereof to a depth of 20.0 μm in a direction opposite to the coating layer is regarded as a surface region, and further, a region thereof which is located further inward than the surface region is regarded as an inner region. Using an EBSD (manufactured by TexSEM Laboratories, Inc.), each measurement region in each of the surface region and the inner region is divided into regular hexagonal regions (pixels). As to each of the divided regions, the orientation of the pixel is measured by obtaining Kikuchi patterns from reflected electrons from an electron beam which has been incident on the polished surface of the sample. The obtained orientation data is analyzed using analysis software for the EBSD, thereby calculating various parameters. The measurement conditions are as set forth below: the acceleration voltage is 15 kV; the dimensions of the measurement region employ a width of 50 μm and, as to the surface region, a thickness of 20 μm from the surface of the cemented carbide or, as to the inner region, a thickness of 20 μm below the surface region toward an inner part of the cemented carbide; and the distance (step size) between adjacent pixels is 0.1 μm. From among the pixels adjacent to a pixel serving as a measurement center, pixels which each have a misorientation of 5° or more with respect to such pixel are excluded from the calculation of KAM values as such excluded pixels are each regarded as straddling the grain boundary of the monocrystal where the pixel serving as a measurement center is located. That is, a KAM value is obtained as an average value of the misorientation of a pixel located in a crystal grain and the misorientations of the pixels which are adjacent to such pixel and which do not straddle the grain boundary of such crystal grain. Then, an average is taken of the KAM values in all the pixels which configure the entire measurement region. It should be noted that the average value of the KAM values is defined as a numerical value obtained by, as to any three measurement regions, taking an average of the KAM values in the above-described manner for each of such measurement regions and then averaging the resultant average values.

In the cemented carbide, the average value of KAM values in the surface region ($KAM_s$) is preferably from 0.35° or more to 0.55° or less. If the $KAM_s$ is 0.55° or less, this leads to a reduced amount of strain so that the starting point for breakage can be suppressed in the surface of the cemented carbide, whereby the generation of cracking and the progress of such cracking can be further suppressed, thereby resulting in a coated cutting tool which is further excellent in terms of fracture resistance and chipping resistance, particularly in terms of fracture resistance. Moreover, from the perspective of ease of manufacturing, $KAM_s$ is preferably 0.35° or more. From the same perspective, $KAM_s$ is more preferably from 0.35° or more to 0.50° or less, and is further preferably from 0.35° or more to 0.45° or less.

In the cemented carbide, the average value of KAM values in the surface region ($KAM_s$) can be controlled by, for example, adjusting the shot material, the average particle size thereof, the shot pressure and the nozzle pitch interval.

In the cemented carbide, the average value of KAM values in the inner region ($KAM_i$) is preferably from 0.35° or more to 0.55° or less. If the $KAM_i$ is 0.55° or less, this leads to a reduced amount of strain so that the starting point for breakage can be suppressed in an inner part of the cemented carbide, whereby the generation of cracking and the progress of such cracking can be further suppressed, thereby resulting in a coated cutting tool which is further excellent in terms of fracture resistance and chipping resistance, particularly in terms of fracture resistance. Moreover, from the perspective of ease of manufacturing, $KAM_i$ is preferably 0.35° or more. From the same perspective, $KAM_i$ is more preferably from 0.35° or more to 0.50° or less, and is further preferably from 0.35° or more to 0.45° or less.

In the cemented carbide, the average value of KAM values in the inner region ($KAM_i$) can be controlled by, for example, adjusting the shot material, the average particle size thereof, the shot pressure and the nozzle pitch interval.

In the coated cutting tool of the present embodiment, the cemented carbide preferably comprises a binder phase and a hard phase. In the present embodiment, the binder phase refers to a phase which binds the particles of the hard phase together, and the hard phase refers to a phase of a high hardness deposit or additive which is introduced with the aim of increasing the deformation resistance of the cemented carbide and improving the elastic modulus, strength, wear resistance and creep characteristics thereof at high temperatures.

In the cemented carbide, the content of the binder phase is preferably from 5.0 mass % or more to 12.0 mass % or less, is more preferably from 5.0 mass % or more to 11.0 mass % or less, and is further preferably from 6.0 mass % or more to 10.0 mass % or less, based on a total amount of the cemented carbide. Further, in the cemented carbide, the content of the hard phase is preferably from 88.0 mass % or more to 95.0 mass % or less, is more preferably from 89.0 mass % or more to 95.0 mass % or less, and is further preferably from 90.0 mass % or more to 94.0 mass % or less, based on a total amount of the cemented carbide. If the coated cutting tool of the present embodiment comprises the cemented carbide having the above-described configuration, such coated cutting tool is further excellent in terms of wear resistance, fracture resistance and chipping resistance.

In the cemented carbide used in the present embodiment, the hard phase is preferably constituted by, for example, a phase of tungsten carbide and a compound phase of other compounds.

In the coated cutting tool of the present embodiment, the cemented carbide preferably comprises a compound phase containing one or more kinds of compounds, each compound consisting of: an element of at least one kind selected from the group consisting of Ti (titanium), Zr (zirconium), Hf (hafnium), V (vanadium), Nb (niobium), Ta (tantalum), Cr (chromium) and Mo (molybdenum); and an element of at least one kind selected from the group consisting of C (carbon), N (nitrogen), O (oxygen) and B (boron). Further, in the cemented carbide, the content of the compound phase is preferably from 3.0 mass % or more to 6.0 mass % or less, is more preferably from 3.0 mass % or more to 5.0 mass % or less, and is further preferably from 4.0 mass % or more to 5.0 mass % or less. If the coated cutting tool of the present embodiment comprises the cemented carbide having the above-described configuration, such coated cutting tool is further excellent in terms of fracture resistance and chipping resistance.

It should be noted that the surface of the substrate may be modified. For instance, a β-free layer may be formed on the surface of a cemented carbide. The operational advantages of the present invention are still provided, even if the substrate surface has been modified in this way.

(Coating Layer)

The average thickness of the coating layer used in the coated cutting tool of the present embodiment is from 5.0 μm or more to 30.0 μm or less. If the average thickness of the coating layer is 5.0 μm or more, this leads to an improvement of wear resistance, and if such average thickness is 30.0 μm or less, this leads to an improvement in the adhesion of the coating layer with the substrate and an improvement of fracture resistance. From the same perspective, the average thickness of the coating layer is preferably from 7.0 μm or more to 29.0 μm or less, is more preferably from 8.0 μm or more to 18.0 μm or less, and is further preferably from 10.0 μm or more to 18.0 μm or less.

(Lower Layer)

The coating layer used in the coated cutting tool of the present embodiment preferably comprises a lower layer and an upper layer formed on a surface of the lower layer, in order from the cemented carbide side.

The lower layer is preferably a Ti compound layer of a layer comprised of a layer of one kind selected from the group consisting of a Ti carbide layer (hereinafter also simply referred to as a "TiC layer"), a Ti nitride layer (hereinafter also simply referred to as a "TiN layer"), a Ti carbonitride layer (hereinafter also simply referred to as a "TiCN layer"), a Ti carboxide layer (hereinafter also simply referred to as a "TiCO layer") and a Ti carboxynitride layer (hereinafter also simply referred to as a "TiCNO layer"), or comprised of layers of two or more kinds selected therefrom. The coating layer preferably comprises such lower layer because this leads to a further improvement in the adhesion between the substrate and the coating layer. The lower layer may be constituted by a single layer or multiple layers (for example, two or three layers). However, the lower layer is preferably constituted by multiple layers, is more preferably constituted by two or three layers, and is further preferably constituted by three layers. Further, the lower layer may include a layer of one kind from among the above various layers or may include multiple layers of one kind therefrom. The lower layer, from the perspective of further improving chipping resistance and fracture resistance, preferably includes a layer of at least one kind selected from the group consisting of a TiN layer, a TiCN layer and a TiCNO layer. From the same perspective, the lower layer further preferably includes: a TiN layer or a TiC layer as the layer closest to the substrate (lowermost layer); a TiCNO layer or a TiCO layer as the layer closest to the upper layer; and a TiCN layer therebetween, and the lower layer particularly preferably includes: a TiN layer as the layer closest to the substrate (lowermost layer); a TiCNO layer as the layer closest to the upper layer; and a TiCN layer therebetween.

In the present embodiment, from the perspective of further increasing the adhesion of the coating layer with the layer (for example, the substrate) located below the coating layer, the average thickness of the lower layer is preferably from 1.5 μm or more to 15.0 μm or less. From the same perspective, the average thickness of the lower layer is more preferably from 3.0 μm or more to 14.0 μm or less, is further preferably from 4.0 μm or more to 12.0 μm or less, and is particularly preferably from 5.0 μm or more to 10.0 μm or less. When the lower layer is constituted by multiple layers, the average thickness of the layer closest to the substrate from among such multiple layers, particularly from the perspective of further improving the adhesion with the layer (for example, the substrate) located below such layer closest to the substrate, is preferably from 0.05 μm or more to 1.0 μm or less. When the lower layer is constituted by multiple layers, the average thickness of the layer closest to the upper layer from among such multiple layers, particularly from the perspective of further increasing the adhesion with the layer (for example, the upper layer) located on such layer closest to the upper layer, is preferably from 0.1 μm or more to 1.5 μm or less.

(Upper Layer)

The upper layer is preferably an α-type aluminum oxide layer (hereinafter also simply referred to as an "α-$Al_2O_3$ layer") comprised of α-type aluminum oxide. If the coating layer comprises such upper layer, this leads to an increase in the wear resistance of the coating layer and of the coated cutting tool. The upper layer may be constituted by a single layer or multiple layers (for example, two or three layers involving different manufacturing steps).

In the present embodiment, from the perspective of sufficiently increasing the wear resistance of the coated cutting tool and achieving excellent fracture resistance and chipping resistance, the average thickness of the upper layer is preferably from 1.5 μm or more to 15.0 μm or less. From the same perspective, the average thickness of the upper layer is more preferably from 3.0 μm or more to 14.0 μm or less, is further preferably from 3.5 μm or more to 12.0 μm or less, and is particularly preferably from 5.0 μm or more to 10.0 μm or less It is preferable for the coating layer to further include a layer comprised of a Ti nitride (TiN layer) on a surface of the upper surface which is opposite to the lower layer. This leads to a further increase in the wear resistance of the coating layer and of the coated cutting tool, and also leads to further excellent visibility between an unused cutting edge and a used cutting edge. If the TiN layer serves as the outermost layer (also referred to as the "uppermost layer") of the coating layer, this leads to further excellent wear resistance of the coating layer and of the coated cutting tool. The average thickness of such layer, from the perspective of providing the effect of excellent wear resistance in a more effective and reliable manner, is preferably from 0.1 μm or more to 2.5 μm or less, is more preferably from 0.1 μm or more to 2.0 μm or less, and is further preferably from 0.1 μm or more to 1.5 μm or less. The average thickness of 2.5 μm or less leads to the tendency of the fracture resistance of the coated cutting tool to be further increased.

The coated cutting tool of the present embodiment is not particularly limited and can be obtained by the method set forth below, by way of example.

Firstly, a layer of one kind selected from the group consisting of a TiC layer, a TiN layer, a TiCN layer, a TiCO layer and a TiCNO layer, or layers of two or more kinds selected therefrom is/are formed, as a lower layer, on a surface of a cemented carbide (substrate). Next, the surface of the lower layer (when the lower layer is comprised of multiple layers, the layer which is the most distant from the substrate from among such multiple layers) is oxidized. Thereafter, an upper layer, being an $\alpha$-$Al_2O_3$ layer, is formed on the oxidized surface of the lower layer. Further, as needed, an outermost layer, being a TiN layer, may be formed on the surface of the upper layer.

More specifically, a TiN layer, which serves as the lower layer, can be formed by chemical vapor deposition with a raw material gas composition of $TiCl_4$: from 5.0 mol % or more to 10.0 mol % or less, $N_2$: from 20 mol % or more to 60 mol % or less, and $H_2$: the balance, a temperature of from 850° C. or higher to 920° C. or lower, and a pressure of from 100 hPa or higher to 400 hPa or lower.

A TiC layer can be formed by chemical vapor deposition with a raw material gas composition of $TiCl_4$: from 1.0 mol % or more to 3.0 mol % or less, $CH_4$: from 4.0 mol % or more to 6.0 mol % or less, and $H_2$: the balance, a temperature of from 990° C. or higher to 1,030° C. or lower, and a pressure of from 50 hPa or higher to 100 hPa or lower.

A TiCN layer can be formed by chemical vapor deposition with a raw material gas composition of $TiCl_4$: from 5.0 mol % or more to 7.0 mol % or less, $CH_3CN$: from 0.5 mol % or more to 1.5 mol % or less, and $H_2$: the balance, a temperature of from 840° C. or higher to 890° C. or lower, and a pressure of from 60 hPa or higher to 80 hPa or lower.

A TiCO layer can be formed by chemical vapor deposition with a raw material gas composition of $TiCl_4$: from 0.5 mol % or more to 1.5 mol % or less, CO: from 2.0 mol % or more to 4.0 mol % or less, and $H_2$: the balance, a temperature of from 975° C. or higher to 1,025° C. or lower, and a pressure of from 60 hPa or higher to 100 hPa or lower.

A TiCNO layer can be formed by chemical vapor deposition with a raw material gas composition of $TiCl_4$: from 3.0 mol % or more to 5.0 mol % or less, CO: from 0.4 mol % or more to 1.0 mol % or less, $N_2$: from 30 mol % or more to 40 mol % or less, and $H_2$: the balance, a temperature of from 975° C. or higher to 1,025° C. or lower, and a pressure of from 90 hPa or higher to 110 hPa or lower.

The oxidation of the surface of the lower layer is performed under the conditions of a gas composition of CO: from 0.1 mol % or more to 1.0 mol % or less, and $H_2$: the balance, a temperature of from 970° C. or higher to 1,020° C. or lower, and a pressure of from 50 hPa or higher to 70 hPa or lower. Here, the oxidation time is preferably from 0.5 minutes or more to 2 minutes or less.

An $\alpha$-$Al_2O_3$ layer, which serves as the upper layer, can be formed by chemical vapor deposition with a raw material gas composition of $AlCl_3$: from 2.0 mol % or more to 5.0 mol % or less, $CO_2$: from 2.5 mol % or more to 4.0 mol % or less, HCl: from 2.0 mol % or more to 3.0 mol % or less, $H_2S$: from 0.25 mol % or more to 0.45 mol % or less, and $H_2$: the balance, a temperature of from 950° C. or higher to 1,130° C. or lower, and a pressure of from 60 hPa or higher to 80 hPa or lower.

In the present embodiment, in order to obtain a desired coated cutting tool, dry shot blasting is preferably performed on the coating layer after the formation of the upper layer. It is preferable for the conditions for dry shot blasting to be: a shot pressure of from 1.7 bar or higher to 1.9 bar or lower; and a shot angle of 90°. In a blasting apparatus used in dry shot blasting, when a shot material is ejected while a nozzle is travelling in a predetermined direction, a pitch interval of the nozzle is preferably from 3 mm or more to 5 mm or less in a direction orthogonal to the travel direction of the nozzle. Further, the speed (travel speed) of the nozzle is preferably from 6,000 mm/minute or more to 7,000 mm/minute or less. The shot material (medium) in dry shot blasting preferably has an average particle size of from 120 μm or more to 400 μm or less (when the shot material is steel, from 380 μm or more to 420 μm or less), more preferably has an average particle size of from 120 μm or more to 150 μm or less, and further preferably has an average particle size of from 120 μm or more to 140 μm or less, and such shot material is preferably a material of one or more kinds selected from the group consisting of SiC, steel, $Al_2O_3$ and $ZrO_2$. It should be noted that, when dry shot blasting is not performed, this causes great plastic deformation in the surface region of the cemented carbide after the formation of the coating layer, so that the difference in the average value of KAM values between the surface region and the inner region is less likely to satisfy the condition represented by formula (1) above.

A TiN layer, which serves as the outermost layer, can be formed by chemical vapor deposition with a raw material gas composition of $TiCl_4$: from 5.0 mol % or more to 10.0 mol % or less, $N_2$: from 20 mol % or more to 60 mol % or less, and $H_2$: the balance, a temperature of from 950° C. or higher to 1,000° C. or lower, and a pressure of from 300 hPa or higher to 400 hPa or lower.

The thickness of each layer in the coating layer used in the coated cutting tool of the present embodiment can be measured by observing a cross-sectional structure of the coated cutting tool, using an optical microscope, a scanning electron microscope (SEM), an FE-SEM, or the like. It should be noted that, as to the average thickness of each layer used in the coated cutting tool of the present embodiment, such average thickness can be obtained by: measuring the thickness of each layer at three or more locations near the position 50 μm from the edge, toward the center of the rake surface of the coated cutting tool; and calculating the arithmetic mean of the resulting measurements. Further, the composition of each layer can be measured from a cross-sectional structure of the coated cutting tool of the present embodiment, using an energy-dispersive X-ray spectroscope (EDS), a wavelength-dispersive X-ray spectroscope (WDS), or the like.

EXAMPLES

Although the present invention will be described in further detail below, with examples, the present invention is not limited to such examples.

A cutting insert of a P15-equivalent cemented carbide (invention samples 1 to 15 and comparative samples 1 to 7) or a P25-equivalent cemented carbide (invention samples 16 and 17 and comparative samples 8 and 9) with a shape of IOS standard CNMG120412 and the composition shown in Table 2 was prepared, as a substrate, from a raw material having the formulation composition shown in Table 1. The edge of such substrate was subjected to round honing by means of an SiC brush, and a surface of the substrate was then washed.

TABLE 1

| Sample No. | Cemented carbide Formulation composition (mass %) |
|---|---|
| Invention sample 1 | 88.4% WC, 1.9% TiN, 0.5% TiC, 1.9% NbC, 0.2% ZrCN, 0.2% $Cr_3C_2$, 6.9% Co |
| Invention sample 2 | 88.4% WC, 1.9% TiN, 0.5% TiC, 1.9% NbC, 0.2% ZrCN, 0.2% $Cr_3C_2$, 6.9% Co |
| Invention sample 3 | 88.4% WC, 1.9% TiN, 0.5% TiC, 1.9% NbC, 0.2% ZrCN, 0.2% $Cr_3C_2$, 6.9% Co |
| Invention sample 4 | 88.4% WC, 1.9% TiN, 0.5% TiC, 1.9% NbC, 0.2% ZrCN, 0.2% $Cr_3C_2$, 6.9% Co |
| Invention sample 5 | 88.4% WC, 1.9% TiN, 0.5% TiC, 1.9% NbC, 0.2% ZrCN, 0.2% $Cr_3C_2$, 6.9% Co |
| Invention sample 6 | 88.4% WC, 1.9% TiN, 0.5% TiC, 1.9% NbC, 0.2% ZrCN, 0.2% $Cr_3C_2$, 6.9% Co |
| Invention sample 7 | 88.4% WC, 1.9% TiN, 0.5% TiC, 1.9% NbC, 0.2% ZrCN, 0.2% $Cr_3C_2$, 6.9% Co |
| Invention sample 8 | 88.4% WC, 1.9% TiN, 0.5% TiC, 1.9% NbC, 0.2% ZrCN, 0.2% $Cr_3C_2$, 6.9% Co |
| Invention sample 9 | 88.4% WC, 1.9% TiN, 0.5% TiC, 1.9% NbC, 0.2% ZrCN, 0.2% $Cr_3C_2$, 6.9% Co |
| Invention sample 10 | 88.4% WC, 1.9% TiN, 0.5% TiC, 1.9% NbC, 0.2% ZrCN, 0.2% $Cr_3C_2$, 6.9% Co |
| Invention sample 11 | 89.8% WC, 1.4% TiN, 0.3% TiC, 1.4% NbC, 0.1% ZrCN, 0.1% $Cr_3C_2$, 6.9% Co |
| Invention sample 12 | 90.0% WC, 1.9% TiN, 0.5% TiC, 1.9% NbC, 0.2% ZrCN, 0.2% $Cr_3C_2$, 5.3% Co |
| Invention sample 13 | 88.4% WC, 1.9% TiN, 0.5% TiC, 1.9% NbC, 0.2% ZrCN, 0.2% $Cr_3C_2$, 6.9% Co |
| Invention sample 14 | 88.4% WC, 1.9% TiN, 0.5% TiC, 1.9% NbC, 0.2% ZrCN, 0.2% $Cr_3C_2$, 6.9% Co |
| Invention sample 15 | 88.4% WC, 1.9% TiN, 0.5% TiC, 1.9% NbC, 0.2% ZrCN, 0.2% $Cr_3C_2$, 6.9% Co |
| Invention sample 16 | 86.3% WC, 1.9% TiN, 0.5% TiC, 1.9% NbC, 0.2% ZrCN, 0.2% $Cr_3C_2$, 9.0% Co |
| Invention sample 17 | 85.5% WC, 2.2% TiN, 0.6% TiC, 2.2% NbC, 0.3% ZrCN, 0.2% $Cr_3C_2$, 9.0% Co |
| Comparative sample 1 | 88.4% WC, 1.9% TiN, 0.5% TiC, 1.9% NbC, 0.2% ZrCN, 0.2% $Cr_3C_2$, 6.9% Co |
| Comparative sample 2 | 88.4% WC, 1.9% TiN, 0.5% TiC, 1.9% NbC, 0.2% ZrCN, 0.2% $Cr_3C_2$, 6.9% Co |
| Comparative sample 3 | 88.4% WC, 1.9% TiN, 0.5% TiC, 1.9% NbC, 0.2% ZrCN, 0.2% $Cr_3C_2$, 6.9% Co |
| Comparative sample 4 | 88.4% WC, 1.9% TiN, 0.5% TiC, 1.9% NbC, 0.2% ZrCN, 0.2% $Cr_3C_2$, 6.9% Co |
| Comparative sample 5 | 88.4% WC, 1.9% TiN, 0.5% TiC, 1.9% NbC, 0.2% ZrCN, 0.2% $Cr_3C_2$, 6.9% Co |
| Comparative sample 6 | 88.4% WC, 1.9% TiN, 0.5% TiC, 1.9% NbC, 0.2% ZrCN, 0.2% $Cr_3C_2$, 6.9% Co |
| Comparative sample 7 | 88.4% WC, 1.9% TiN, 0.5% TiC, 1.9% NbC, 0.2% ZrCN, 0.2% $Cr_3C_2$, 6.9% Co |
| Comparative sample 8 | 86.3% WC, 1.9% TiN, 0.5% TiC, 1.9% NbC, 0.2% ZrCN, 0.2% $Cr_3C_2$, 9.0% Co |
| Comparative sample 9 | 85.5% WC, 2.2% TiN, 0.6% TiC, 2.2% NbC, 0.3% ZrCN, 0.2% $Cr_3C_2$, 9.0% Co |

TABLE 2

| | Cemented carbide ||||||
|---|---|---|---|---|---|---|
| | Hard phase ||||| Binder phase ||
| | Tungsten carbide || Compound phase || Entire hard phase | Binder phase ||
| Sample No. | Composition | (mass %) | Composition | (mass %) | (mass %) | Composition | (mass %) |
| Invention sample 1 | WC | 88.4 | TiN, TiC, NbC, ZrCN, $Cr_3C_2$ | 4.7 | 93.1 | Co | 6.9 |
| Invention sample 2 | WC | 88.4 | TiN, TiC, NbC, ZrCN, $Cr_3C_2$ | 4.7 | 93.1 | Co | 6.9 |
| Invention sample 3 | WC | 88.4 | TiN, TiC, NbC, ZrCN, $Cr_3C_2$ | 4.7 | 93.1 | Co | 6.9 |
| Invention sample 4 | WC | 88.4 | TiN, TiC, NbC, ZrCN, $Cr_3C_2$ | 4.7 | 93.1 | Co | 6.9 |
| Invention sample 5 | WC | 88.4 | TiN, TiC, NbC, ZrCN, $Cr_3C_2$ | 4.7 | 93.1 | Co | 6.9 |
| Invention sample 6 | WC | 88.4 | TiN, TiC, NbC, ZrCN, $Cr_3C_2$ | 4.7 | 93.1 | Co | 6.9 |
| Invention sample 7 | WC | 88.4 | TiN, TiC, NbC, ZrCN, $Cr_3C_2$ | 4.7 | 93.1 | Co | 6.9 |
| Invention sample 8 | WC | 88.4 | TiN, TiC, NbC, ZrCN, $Cr_3C_2$ | 4.7 | 93.1 | Co | 6.9 |
| Invention sample 9 | WC | 88.4 | TiN, TiC, NbC, ZrCN, $Cr_3C_2$ | 4.7 | 93.1 | Co | 6.9 |
| Invention sample 10 | WC | 88.4 | TiN, TiC, NbC, ZrCN, $Cr_3C_2$ | 4.7 | 93.1 | Co | 6.9 |
| Invention sample 11 | WC | 89.8 | TiN, TaC, ZrCN, VC, $Cr_3C_2$ | 3.3 | 93.1 | Co | 6.9 |
| Invention sample 12 | WC | 90.0 | TiN, TiC, NbC, ZrCN, $Cr_3C_2$ | 4.7 | 94.7 | Co | 5.3 |
| Invention sample 13 | WC | 88.4 | TiN, TiC, NbC, ZrCN, $Cr_3C_2$ | 4.7 | 93.1 | Co | 6.9 |
| Invention sample 14 | WC | 88.4 | TiN, TiC, NbC, ZrCN, $Cr_3C_2$ | 4.7 | 93.1 | Co | 6.9 |
| Invention sample 15 | WC | 88.4 | TiN, TiC, NbC, ZrCN, $Cr_3C_2$ | 4.7 | 93.1 | Co | 6.9 |
| Invention sample 16 | WC | 86.3 | TiN, TiC, NbC, ZrCN, $Cr_3C_2$ | 4.7 | 91.0 | Co | 9.0 |
| Invention sample 17 | WC | 85.5 | TiN, TaC, ZrCN, VC, $Cr_3C_2$ | 5.5 | 91.0 | Co | 9.0 |
| Comparative sample 1 | WC | 88.4 | TiN, TiC, NbC, ZrCN, $Cr_3C_2$ | 4.7 | 93.1 | Co | 6.9 |

TABLE 2-continued

| | Cemented carbide | | | | | | |
|---|---|---|---|---|---|---|---|
| | Hard phase | | | | | Binder phase | |
| | Tungsten carbide | | Compound phase | | Entire hard phase | | |
| Sample No. | Composition | (mass %) | Composition | (mass %) | (mass %) | Composition | (mass %) |
| Comparative sample 2 | WC | 88.4 | TiN, TiC, NbC, ZrCN, $Cr_3C_2$ | 4.7 | 93.1 | Co | 6.9 |
| Comparative sample 3 | WC | 88.4 | TiN, TiC, NbC, ZrCN, $Cr_3C_2$ | 4.7 | 93.1 | Co | 6.9 |
| Comparative sample 4 | WC | 88.4 | TiN, TiC, NbC, ZrCN, $Cr_3C_2$ | 4.7 | 93.1 | Co | 6.9 |
| Comparative sample 5 | WC | 88.4 | TiN, TiC, NbC, ZrCN, $Cr_3C_2$ | 4.7 | 93.1 | Co | 6.9 |
| Comparative sample 6 | WC | 88.4 | TiN, TiC, NbC, ZrCN, $Cr_3C_2$ | 4.7 | 93.1 | Co | 6.9 |
| Comparative sample 7 | WC | 88.4 | TiN, TiC, NbC, ZrCN, $Cr_3C_2$ | 4.7 | 93.1 | Co | 6.9 |
| Comparative sample 8 | WC | 86.3 | TiN, TiC, NbC, ZrCN, $Cr_3C_2$ | 4.7 | 91.0 | Co | 9.0 |
| Comparative sample 9 | WC | 85.5 | TiN, TaC, ZrCN, VC, $Cr_3C_2$ | 5.5 | 91.0 | Co | 9.0 |

After the substrate was washed, a coating layer was formed by chemical vapor deposition. As to invention samples 1 to 17, firstly, the substrate was inserted into an external heating chemical vapor deposition apparatus, and a lower layer, whose composition is shown in Table 4, was formed on the substrate surface, in the order of a first layer, a second layer and a third layer, so as to have the respective average thicknesses shown in Table 4 under the raw material gas composition, temperature and pressure conditions shown in Table 3. Then, the surface of the lower layer was oxidized for 1 minute under the conditions of: a gas composition of CO: 0.5 mol % and $H_2$: 99.5 mol %, a temperature of 1,000° C., and a pressure of 70 hPa. Next, an upper layer, being comprised of α-type aluminum oxide, was formed on the oxidized surface of the lower layer so as to have the average thickness shown in Table 4 under the raw material gas composition, temperature and pressure conditions shown in Table 3. Thereafter, dry shot blasting was performed on the upper layer under the shot conditions shown in Table 5, using the shot material shown in Table 5. Lastly, an uppermost layer, whose composition is shown in Table 4, was formed on the surface of the upper layer so as to have the average thickness shown in Table 4 under the raw material gas composition, temperature and pressure conditions shown in Table 3. As a result, the coated cutting tools of invention samples 1 to 17 were obtained.

Meanwhile, as to comparative samples 1 to 9, firstly, the substrate was inserted into an external heating chemical vapor deposition apparatus, and a lower layer, whose composition is shown in Table 4, was formed on the substrate surface, in the order of a first layer, a second layer and a third layer, so as to have the respective average thicknesses shown in Table 4 under the raw material gas composition, temperature and pressure conditions shown in Table 3. Then, the surface of the lower layer was oxidized for 1 minute under the conditions of: a gas composition of CO: 0.5 mol % and $H_2$: 99.5 mol %, a temperature of 1,000° C., and a pressure of 70 hPa. Next, an upper layer, whose composition is shown in Table 4, was formed on the oxidized surface of the lower layer so as to have the average thickness shown in Table 4 under the raw material gas composition, temperature and pressure conditions shown in Table 3. Thereafter, dry shot blasting was performed on the upper layer under the shot conditions shown in Table 5, using the shot material shown in Table 5. Lastly, an uppermost layer, whose composition is shown in Table 4, was formed on the surface of the upper layer so as to have the average thickness shown in Table 4 under the raw material gas composition, temperature and pressure conditions shown in Table 3. As a result, the coated cutting tools of comparative samples 1 to 9 were obtained.

TABLE 3

| Each layer composition | Temperature (° C.) | Pressure (hPa) | Raw material gas composition (mol %) |
|---|---|---|---|
| TiN (lowermost layer) | 900 | 350 | $TiCl_4$: 7.5%, $N_2$: 40.0%, $H_2$: 52.5% |
| TiC | 1,000 | 75 | $TiCl_4$: 2.4%, $CH_4$: 4.6%, $H_2$: 93.0% |
| TiCN | 850 | 70 | $TiCl_4$: 6.0%, $CH_3CN$: 1.0%, $H_2$: 93.0% |
| TiCNO | 1,000 | 100 | $TiCl_4$: 3.5%, CO: 0.7%, $N_2$: 35.5%, $H_2$: 60.3% |
| TiCO | 1,000 | 80 | $TiCl_4$: 1.5%, CO: 2.5%, $H_2$: 96.0% |
| α-type $Al_2O_3$ | 1,000 | 70 | $AlCl_3$: 2.5%, $CO_2$: 3.0%, HCl: 2.3%, $H_2S$: 0.35%, $H_2$: 91.85% |
| TiN (uppermost layer) | 1,000 | 350 | $TiCl_4$: 7.5%, $N_2$: 40.0%, $H_2$: 52.5% |
| TiCN (uppermost layer) | 1,000 | 350 | $TiCl_4$: 6.0%, $CH_3CN$: 1.0%, $H_2$: 93.0% |

TABLE 4

| Sample No. | Coating layer Lower layer ||||||| Coating layer |||||
|---|---|---|---|---|---|---|---|---|---|---|---|---|
| | First layer || Second layer || Third layer || Thickness of entire lower layer (μm) | Upper layer ||| Uppermost layer || Thickness of entire coating layer (μm) |
| | Composition | Average thickness (μm) | Composition | Average thickness (μm) | Composition | Average thickness (μm) | | Composition | Crystal system | Average thickness (μm) | Composition | Average thickness (μm) | |
| Invention sample 1 | TiN | 0.4 | TiCN | 5.5 | TiCNO | 0.3 | 6.2 | $Al_2O_3$ | α | 9.5 | TiN | 0.5 | 16.2 |
| Invention sample 2 | TiN | 0.4 | TiCN | 5.5 | TiCNO | 0.3 | 6.2 | $Al_2O_3$ | α | 9.5 | TiN | 0.5 | 16.2 |
| Invention sample 3 | TiN | 0.4 | TiCN | 5.5 | TiCNO | 0.3 | 6.2 | $Al_2O_3$ | α | 9.5 | TiN | 0.5 | 16.2 |
| Invention sample 4 | TiN | 0.4 | TiCN | 5.5 | TiCNO | 0.3 | 6.2 | $Al_2O_3$ | α | 9.5 | TiN | 0.5 | 16.2 |
| Invention sample 5 | TiN | 0.4 | TiCN | 3.0 | TiCNO | 0.3 | 3.7 | | | | | | |
| Invention sample 6 | TiN | 0.4 | TiCN | 13.0 | TiCNO | 0.3 | 13.7 | | | | | | |
| Invention sample 7 | TiC | 0.4 | TiCN | 5.5 | TiCNO | 0.3 | 6.2 | | | | | | |
| Invention sample 8 | TiN | 0.4 | TiCN | 5.5 | TiCO | 0.3 | 6.2 | | | | | | |
| Invention sample 9 | TiN | 0.4 | TiCN | 3.0 | TiCNO | 0.3 | 3.7 | | | | | | |
| Invention sample 10 | TiN | 0.4 | TiCN | 13.0 | TiCNO | 0.3 | 13.7 | | | | | | |
| Invention sample 11 | TiN | 0.4 | TiCN | 5.5 | TiCNO | 0.3 | 6.2 | | | | | | |
| Invention sample 12 | TiN | 0.4 | TiCN | 5.5 | TiCNO | 0.3 | 6.2 | | | | | | |
| Invention sample 13 | TiN | 0.4 | TiCN | 5.5 | TiCNO | 0.3 | 6.2 | | | | | | |
| Invention sample 14 | TiN | 0.4 | TiCN | 5.5 | TiCNO | 0.3 | 6.2 | | | | | | |
| Invention sample 15 | TiN | 0.4 | TiCN | 5.5 | TiCNO | 0.3 | 6.2 | | | | | | |
| Invention sample 16 | TiN | 0.4 | TiCN | 5.5 | TiCNO | 0.3 | 6.2 | | | | | | |
| Invention sample 17 | TiN | 0.4 | TiCN | 5.5 | TiCNO | 0.3 | 6.2 | | | | | | |
| Comparative sample 1 | TiN | 0.4 | TiCN | 5.5 | TiCNO | 0.3 | 6.2 | | | | | | |
| Comparative sample 2 | TiN | 0.4 | TiCN | 4.0 | TiCNO | 0.3 | 4.7 | | | | | | |
| Comparative sample 3 | TiN | 0.4 | TiCN | 11.5 | TiCNO | 0.3 | 12.2 | | | | | | |
| Comparative sample 4 | TiN | 0.4 | TiCN | 16.0 | TiCNO | 0.3 | 16.7 | | | | | | |
| Comparative sample 5 | TiN | 0.4 | TiCN | 2.0 | TiCNO | 0.3 | 2.7 | | | | | | |
| Comparative sample 6 | TiN | 0.4 | TiCN | 16.0 | TiCNO | 0.3 | 16.7 | | | | | | |
| Comparative sample 7 | TiN | 0.4 | TiCN | 4.0 | TiCNO | 0.3 | 4.7 | | | | | | |
| Comparative sample 8 | TiN | 0.4 | TiCN | 5.5 | TiCNO | 0.3 | 6.2 | | | | | | |
| Comparative sample 9 | TiN | 0.4 | TiCN | 5.5 | TiCNO | 0.3 | 6.2 | | | | | | |

TABLE 4-continued

| Sample | | | | | | | |
|---|---|---|---|---|---|---|---|
| Invention sample 5 | Al$_2$O$_3$ | α | 13.0 | TiN | 0.5 | 17.2 | |
| Invention sample 6 | Al$_2$O$_3$ | α | 3.0 | TiN | 0.5 | 17.2 | |
| Invention sample 7 | Al$_2$O$_3$ | α | 9.5 | TiN | 0.5 | 16.2 | |
| Invention sample 8 | Al$_2$O$_3$ | α | 9.5 | TiN | 0.5 | 16.2 | |
| Invention sample 9 | Al$_2$O$_3$ | α | 3.0 | TiN | 2.0 | 8.7 | |
| Invention sample 10 | Al$_2$O$_3$ | α | 13.0 | TiN | 2.0 | 28.7 | |
| Invention sample 11 | Al$_2$O$_3$ | α | 9.5 | TiN | 0.5 | 16.2 | |
| Invention sample 12 | Al$_2$O$_3$ | α | 9.5 | TiN | 0.5 | 16.2 | |
| Invention sample 13 | Al$_2$O$_3$ | α | 9.5 | TiN | 0.5 | 16.2 | |
| Invention sample 14 | Al$_2$O$_3$ | α | 9.5 | TiN | 0.5 | 16.2 | |
| Invention sample 15 | Al$_2$O$_3$ | α | 9.5 | TiN | 0.5 | 16.2 | |
| Invention sample 16 | Al$_2$O$_3$ | α | 9.5 | TiN | 0.5 | 16.2 | |
| Invention sample 17 | Al$_2$O$_3$ | α | 9.5 | TiN | 0.5 | 16.2 | |
| Comparative sample 1 | Al$_2$O$_3$ | α | 9.5 | TiN | 0.5 | 16.2 | |
| Comparative sample 2 | Al$_2$O$_3$ | α | 11.5 | TiN | 0.5 | 16.7 | |
| Comparative sample 3 | Al$_2$O$_3$ | α | 4.0 | TiCN | 0.5 | 16.7 | |
| Comparative sample 4 | Al$_2$O$_3$ | α | 16.0 | TiCN | 0.5 | 33.2 | |
| Comparative sample 5 | Al$_2$O$_3$ | α | 1.5 | TiCN | 0.3 | 4.5 | |
| Comparative sample 6 | Al$_2$O$_3$ | α | 16.0 | TiCN | 0.5 | 33.2 | |
| Comparative sample 7 | Al$_2$O$_3$ | α | 11.5 | TiN | 0.5 | 16.7 | |
| Comparative sample 8 | Al$_2$O$_3$ | α | 9.5 | TiN | 0.5 | 16.2 | |
| Comparative sample 9 | Al$_2$O$_3$ | α | 9.5 | TiN | 0.5 | 16.2 | |

TABLE 5

| | Dry shot blasting conditions | | | | | |
|---|---|---|---|---|---|---|
| | Shot material | | Shot conditions | | | |
| Sample No. | Material | Average thickness (μm) | Shot angle (°) | Shot pressure (bar) | Nozzle speed (mm/min) | Nozzle pitch interval (mm) |
| Invention sample 1 | Al$_2$O$_3$ | 130 | 90 | 1.8 | 6,500 | 5 |
| Invention sample 2 | SiC | 130 | 90 | 1.8 | 7,000 | 5 |
| Invention sample 3 | Al$_2$O$_3$ | 120 | 90 | 1.8 | 7,000 | 5 |
| Invention sample 4 | Al$_2$O$_3$ | 130 | 90 | 1.8 | 6,500 | 5 |
| Invention sample 5 | Al$_2$O$_3$ | 130 | 90 | 1.8 | 6,500 | 5 |
| Invention sample 6 | Al$_2$O$_3$ | 130 | 90 | 1.8 | 6,500 | 5 |
| Invention sample 7 | Al$_2$O$_3$ | 130 | 90 | 1.8 | 6,500 | 5 |
| Invention sample 8 | Al$_2$O$_3$ | 130 | 90 | 1.8 | 6,500 | 5 |
| Invention sample 9 | Al$_2$O$_3$ | 130 | 90 | 1.8 | 6,500 | 5 |
| Invention sample 10 | Al$_2$O$_3$ | 130 | 90 | 1.8 | 6,500 | 5 |
| Invention sample 11 | SiC | 140 | 90 | 1.8 | 6,000 | 5 |

TABLE 5-continued

| | Dry shot blasting conditions | | | | | |
|---|---|---|---|---|---|---|
| | Shot material | | Shot conditions | | | |
| Sample No. | Material | Average thickness (μm) | Shot angle (°) | Shot pressure (bar) | Nozzle speed (mm/min) | Nozzle pitch interval (mm) |
| Invention sample 12 | SiC | 140 | 90 | 1.8 | 6,000 | 5 |
| Invention sample 13 | Steel | 400 | 90 | 1.8 | 6,500 | 5 |
| Invention sample 14 | Al₂O₃ | 120 | 90 | 1.7 | 7,000 | 5 |
| Invention sample 15 | Al₂O₃ | 130 | 90 | 1.8 | 6,500 | 3 |
| Invention sample 16 | SiC | 140 | 90 | 1.8 | 6,000 | 5 |
| Invention sample 17 | SiC | 140 | 90 | 1.8 | 6,000 | 5 |
| Comparative sample 1 | Al₂O₃ | 130 | 90 | 2.5 | 6,500 | 9 |
| Comparative sample 2 | Al₂O₃ | 50 | 90 | 1.8 | 6,500 | 9 |
| Comparative sample 3 | SiC | 50 | 90 | 1.8 | 7,000 | 9 |
| Comparative sample 4 | Al₂O₃ | 130 | 90 | 1.8 | 6,500 | 5 |
| Comparative sample 5 | Al₂O₃ | 130 | 90 | 1.8 | 6,500 | 5 |
| Comparative sample 6 | Al₂O₃ | 130 | 90 | 1.8 | 6,500 | 3 |
| Comparative sample 7 | Al₂O₃ | 50 | 90 | 1.8 | 6,500 | 5 |
| Comparative sample 8 | Al₂O₃ | 130 | 90 | 2.5 | 6,500 | 5 |
| Comparative sample 9 | Al₂O₃ | 130 | 90 | 2.5 | 6,500 | 9 |

The thickness of each layer of each of the samples was obtained as set forth below. That is, using an FE-SEM, the average thickness was obtained by: measuring the thickness of each layer, from each of the cross-sectional surfaces at three locations near the position 50 μm from the edge of the coated cutting tool, toward the center of the rake surface thereof; and calculating the arithmetic mean of the resulting measurements. Using an EDS, the composition of each layer of the obtained sample was measured from the cross-sectional surface near the position 50 μm from the edge of the coated cutting tool, toward the center of the rake surface thereof.

KAM values and the average value thereof in each of the surface region and the inner region in the cemented carbide were measured as set forth below. A sample of a coated cutting tool was polished in a direction orthogonal to the surface of such sample so that a cross-sectional surface was exposed. With regard to a part of such cross-sectional surface which consisted of the cemented carbide, a region of the cemented carbide which ranged from the surface thereof to a depth of 20.0 μm in a direction opposite to the coating layer was regarded as a surface region, and further, a region thereof which was located further inward than the surface region was regarded as an inner region. Using an EBSD (manufactured by TexSEM Laboratories, Inc.), each measurement region in each of the surface region and the inner region was divided into regular hexagonal regions (pixels). As to each of the divided regions, the orientation of the pixel was measured by obtaining Kikuchi patterns from reflected electrons from an electron beam which had been incident on the polished surface of the sample. The obtained orientation data was analyzed using analysis software for the EBSD, thereby calculating various parameters. The measurement conditions were as set forth below: the acceleration voltage was 15 kV; the dimensions of the measurement region employed a width of 50 μm and, as to the surface region, a thickness of 20.0 μm from the surface of the cemented carbide or, as to the inner region, a thickness corresponding to the remainder of the cemented carbide; and the distance (step size) between adjacent pixels was 0.1 μm. From among the pixels adjacent to a pixel serving as a measurement center, pixels which each had a misorientation of 5° or more with respect to such pixel were excluded from the calculation of KAM values as such excluded pixels were each regarded as straddling the grain boundary of the monocrystal where the pixel serving as a measurement center was located. That is, a KAM value was obtained as an average value of the misorientation of a pixel located in a crystal grain and the misorientations of the pixels which were adjacent to such pixel and which did not straddle the grain boundary of such crystal grain. Then, an average was taken of the KAM values in all the pixels which configured the entire measurement region. It should be noted that the average value of the KAM values was defined as a numerical value obtained by, as to any three measurement regions, taking an average of the KAM values in the above-described manner for each of such measurement regions and then averaging the resultant average values. Based on the above results, the relationship between the average value of KAM values in the surface region ($KAM_s$) and the average value of KAM values in the inner region ($KAM_i$) was obtained. The results are shown in Table 6.

TABLE 6

| Sample No. | Cemented carbide Average value of KAM values | | |
|---|---|---|---|
| | Surface region (°) KAM$_s$ | Inner region (°) KAM$_i$ | Difference (°) between the surface region and the inner region \| KAM$_s$ − KAM$_i$ \| |
| Invention sample 1 | 0.45 | 0.45 | 0.00 |
| Invention sample 2 | 0.54 | 0.44 | 0.10 |
| Invention sample 3 | 0.54 | 0.53 | 0.01 |
| Invention sample 4 | 0.44 | 0.42 | 0.02 |
| Invention sample 5 | 0.45 | 0.44 | 0.01 |
| Invention sample 6 | 0.45 | 0.45 | 0.00 |
| Invention sample 7 | 0.45 | 0.45 | 0.00 |
| Invention sample 8 | 0.44 | 0.43 | 0.01 |
| Invention sample 9 | 0.44 | 0.43 | 0.01 |
| Invention sample 10 | 0.45 | 0.44 | 0.01 |
| Invention sample 11 | 0.50 | 0.46 | 0.04 |
| Invention sample 12 | 0.49 | 0.46 | 0.03 |
| Invention sample 13 | 0.42 | 0.36 | 0.06 |
| Invention sample 14 | 0.57 | 0.55 | 0.02 |
| Invention sample 15 | 0.45 | 0.47 | 0.02 |
| Invention sample 16 | 0.50 | 0.46 | 0.04 |
| Invention sample 17 | 0.50 | 0.45 | 0.05 |
| Comparative sample 1 | 0.66 | 0.45 | 0.21 |
| Comparative sample 2 | 0.68 | 0.49 | 0.19 |
| Comparative sample 3 | 0.67 | 0.49 | 0.18 |
| Comparative sample 4 | 0.45 | 0.45 | 0.00 |
| Comparative sample 5 | 0.45 | 0.45 | 0.00 |
| Comparative sample 6 | 0.45 | 0.47 | 0.02 |
| Comparative sample 7 | 0.61 | 0.45 | 0.16 |
| Comparative sample 8 | 0.66 | 0.50 | 0.16 |
| Comparative sample 9 | 0.66 | 0.45 | 0.21 |

Cutting tests 1 and 2 for evaluating fracture resistance and chipping resistance were conducted using the obtained samples under the following conditions. The results of the respective cutting tests are shown in Table 7.

[Cutting Test 1]
Substrate: P15-equivalent cemented carbide (invention samples 1 to 15 and comparative samples 1 to 7)
Workpiece material: SCM415 round bar with two grooves
Cutting speed: 150 m/min
Feed: 0.25 mm/rev
Depth of cut: 1.0 mm
Coolant: used
Evaluation items: A time when a sample was fractured or had a maximum flank wear width of 0.3 mm was defined as the end of the tool life, and the machining time to reach the end of the tool life was measured. The damage state after a machining time of 5 minutes was checked.

[Cutting Test 2]
Substrate: P25-equivalent cemented carbide (invention samples 16 and 17 and comparative samples 8 and 9)
Workpiece material: SCM415 round bar with two grooves
Cutting speed: 150 m/min
Feed: 0.30 mm/rev
Depth of cut: 2.0 mm
Coolant: used
Evaluation items: A time when a sample was fractured or had a maximum flank wear width of 0.3 mm was defined as the end of the tool life, and the machining time to reach the end of the tool life was measured. The damage state after a machining time of 5 minutes was checked.

As to the machining time to reach the end of the tool life in the cutting tests, evaluations were made with grade "A" for 13 minutes or more, grade "B" for 8 minutes or more and less than 13 minutes, and grade "C" for less than 8 minutes. The evaluation results are shown in Table 7.

TABLE 7

| | Cutting test | | |
|---|---|---|---|
| Sample No. | Damage state after a machining time of 5 min. | Machining time (min) | Grade |
| Invention sample 1 | Normal wear | 15 | A |
| Invention sample 2 | Normal wear | 10 | B |
| Invention sample 3 | Normal wear | 12 | B |
| Invention sample 4 | Normal wear | 15 | A |
| Invention sample 5 | Normal wear | 16 | A |
| Invention sample 6 | Normal wear | 17 | A |
| Invention sample 7 | Normal wear | 14 | A |
| Invention sample 8 | Normal wear | 14 | A |
| Invention sample 9 | Normal wear | 8 | B |
| Invention sample 10 | Normal wear | 19 | A |
| Invention sample 11 | Normal wear | 12 | B |
| Invention sample 12 | Normal wear | 13 | A |
| Invention sample 13 | Normal wear | 16 | A |
| Invention sample 14 | Normal wear | 9 | B |
| Invention sample 15 | Normal wear | 16 | A |
| Invention sample 16 | Normal wear | 16 | A |
| Invention sample 17 | Normal wear | 18 | A |
| Comparative sample 1 | Fracturing | 3 | C |
| Comparative sample 2 | Fracturing | 4 | C |
| Comparative sample 3 | Fracturing | 5 | C |
| Comparative sample 4 | Fracturing | 4 | C |
| Comparative sample 5 | Normal wear | 5 | C |
| Comparative sample 6 | Fracturing | 5 | C |
| Comparative sample 7 | Fracturing | 5 | C |
| Comparative sample 8 | Chipping | 7 | C |
| Comparative sample 9 | Fracturing | 5 | C |

The results of FIG. 7 show that each invention sample had grade "B" or higher in the cutting test. Meanwhile, each comparative sample had grade "C" in the cutting test. Further, with regard to the damage state after 5 minutes from the start of machining, each invention sample indicated normal wear, whereas chipping was found in comparative sample 8, and fracturing occurred in comparative samples 1 to 4, 6, 7 and 9 before the elapse of 5 minutes, which did not allow the machining to be performed anymore.

It is apparent from the above results that each invention sample has excellent fracture resistance and chipping resistance, thereby resulting in a longer tool life.

INDUSTRIAL APPLICABILITY

The coated cutting tool according to the present invention has excellent chipping resistance and fracture resistance, whereby the tool life can be extended more than that involved in the prior art, and, from such perspective, the coated cutting tool has industrial applicability.

REFERENCE SIGNS LIST

1: Substrate, 1*a*: Surface region, 1*b*: Inner region, 2: Lower layer, 3: Upper layer, 4: Uppermost layer, 5: Coating layer, 6: Coated cutting tool.

What is claimed is:
1. A coated cutting tool comprising:
a cemented carbide;
a coating layer formed on a surface of the cemented carbide;
a surface region in the cemented carbide extending from the surface of the cemented carbide in a direction opposite from the coating layer; and an inner region in the cemented carbide positioned on an opposite side of the surface region from the coating layer that extends up to a thickness corresponding to a remainder of the cemented carbide, wherein:

an average thickness of the coating layer is from 5.0 μm or more to 30.0 μm or less;

in the coated cemented carbide, the surface region ranges from the surface of the cemented carbide to a depth of 20.0 μm, and an average value of KAM values in the surface region and an average value of KAM values in the inner region does not satisfy a condition represented by formula (1) below:

$$0.00° \leq |KAM_s - KAM_i| \leq 0.10° \quad (1)$$

(In formula (1), $KAM_s$ denotes an average value of KAM values in the surface region, and $KAM_i$ denotes an average value of KAM values in the inner region), and the $KAM_s$ is outside of the range from 0.35° or more to 0.57° or less;

the coated cemented carbide is subjected to dry shot blasting by setting shot pressure from 1.7 bar or higher to 1.9 bar or lower, using shot material with an average particle size from 120 μm or more to 420 μm or less, setting a shot angle to 90°, setting nozzle speed to 6,000 mm/minute or more to 7,000 mm/minute or less, and setting nozzle pitch interval to 3 mm or more to 5 mm or less;

after the dry shot blasting, the average value of KAM values in the surface region and the average value of KAM values in the inner region satisfy the condition represented by formula (1), and the $KAM_s$ is from 0.35° or more to 0.57° or less.

2. The coated cutting tool according to claim 1, wherein the $KAM_S$ is from 0.35° or more to 0.55° or less after the dry shot blasting.

3. The coated cutting tool according to claim 1, wherein the $KAM_i$ is from 0.35° or more to 0.55° or less after the dry shot blasting.

4. The coated cutting tool according to claim 1, wherein the cemented carbide comprises 5.0 mass % or more to 12.0 mass % or less of a binder phase.

5. The coated cutting tool according to claim 1, wherein:
the cemented carbide comprises a compound phase containing one or more kinds of a compound or compounds, each compound consisting of: an element of at least one kind selected from the group consisting of Ti, Zr, Hf, V, Nb, Ta, Cr and Mo; and an element of at least one kind selected from the group consisting of C, N, O and B; and
the cemented carbide comprises 3.0 mass % or more to 6.0 mass % or less of the compound phase.

6. The coated cutting tool according to claim 1, wherein:
the coating layer comprises a lower layer and an upper layer formed on a surface of the lower layer in order from the cemented carbide side;
the lower layer has an average thickness of from 1.5 μm or more to 15.0 μm or less;
the lower layer is a Ti compound layer comprised of a layer of one kind selected from the group consisting of a Ti carbide layer, a Ti nitride layer, a Ti carbonitride layer, a Ti carboxide layer and a Ti carboxynitride layer, or comprised of layers of two or more kinds selected therefrom;
the upper layer has an average thickness of from 1.5 μm or more to 15.0 μm or less; and
the upper layer is an α-type aluminum oxide layer comprised of α-type aluminum oxide.

7. The coated cutting tool according to claim 2, wherein the $KAM_i$ is from 0.35° or more to 0.55° or less after the dry shot blasting.

8. The coated cutting tool according to claim 2, wherein the cemented carbide comprises 5.0 mass % or more to 12.0 mass % or less of a binder phase.

9. The coated cutting tool according to claim 3, wherein the cemented carbide comprises 5.0 mass % or more to 12.0 mass % or less of a binder phase.

10. The coated cutting tool according to claim 7, wherein the cemented carbide comprises 5.0 mass % or more to 12.0 mass % or less of a binder phase.

11. The coated cutting tool according to claim 2, wherein:
the cemented carbide comprises a compound phase containing one or more kinds of a compound or compounds, each compound consisting of: an element of at least one kind selected from the group consisting of Ti, Zr, Hf, V, Nb, Ta, Cr and Mo; and an element of at least one kind selected from the group consisting of C, N, O and B; and
the cemented carbide comprises 3.0 mass % or more to 6.0 mass % or less of the compound phase.

12. The coated cutting tool according to claim 3, wherein:
the cemented carbide comprises a compound phase containing one or more kinds of a compound or compounds, each compound consisting of: an element of at least one kind selected from the group consisting of Ti, Zr, Hf, V, Nb, Ta, Cr and Mo; and an element of at least one kind selected from the group consisting of C, N, O and B; and
the cemented carbide comprises 3.0 mass % or more to 6.0 mass % or less of the compound phase.

13. The coated cutting tool according to claim 4, wherein:
the cemented carbide comprises a compound phase containing one or more kinds of a compound or compounds, each compound consisting of: an element of at least one kind selected from the group consisting of Ti, Zr, Hf, V, Nb, Ta, Cr and Mo; and an element of at least one kind selected from the group consisting of C, N, O and B; and
the cemented carbide comprises 3.0 mass % or more to 6.0 mass % or less of the compound phase.

14. The coated cutting tool according to claim 7, wherein:
the cemented carbide comprises a compound phase containing one or more kinds of a compound or compounds, each compound consisting of: an element of at least one kind selected from the group consisting of Ti, Zr, Hf, V, Nb, Ta, Cr and Mo; and an element of at least one kind selected from the group consisting of C, N, O and B; and
the cemented carbide comprises 3.0 mass % or more to 6.0 mass % or less of the compound phase.

15. The coated cutting tool according to claim 8, wherein:
the cemented carbide comprises a compound phase containing one or more kinds of a compound or compounds, each compound consisting of: an element of at least one kind selected from the group consisting of Ti, Zr, Hf, V, Nb, Ta, Cr and Mo; and an element of at least one kind selected from the group consisting of C, N, O and B; and
the cemented carbide comprises 3.0 mass % or more to 6.0 mass % or less of the compound phase.

16. The coated cutting tool according to claim 9, wherein:
the cemented carbide comprises a compound phase containing one or more kinds of a compound or compounds, each compound consisting of: an element of at least one kind selected from the group consisting of Ti, Zr, Hf, V, Nb, Ta, Cr and Mo; and an element of at least one kind selected from the group consisting of C, N, O and B; and the cemented carbide comprises 3.0 mass % or more to 6.0 mass % or less of the compound phase.

17. The coated cutting tool according to claim 10, wherein:

the cemented carbide comprises a compound phase containing one or more kinds of a compound or compounds, each compound consisting of: an element of at least one kind selected from the group consisting of Ti, Zr, Hf, V, Nb, Ta, Cr and Mo; and an element of at least one kind selected from the group consisting of C, N, O and B; and the cemented carbide comprises 3.0 mass % or more to 6.0 mass % or less of the compound phase.

18. The coated cutting tool according to claim 2, wherein:

the coating layer comprises a lower layer and an upper layer formed on a surface of the lower layer in order from the cemented carbide side;

the lower layer has an average thickness of from 1.5 μm or more to 15.0 μm or less;

the lower layer is a Ti compound layer comprised of a layer of one kind selected from the group consisting of a Ti carbide layer, a Ti nitride layer, a Ti carbonitride layer, a Ti carboxide layer and a Ti carboxynitride layer, or comprised of layers of two or more kinds selected therefrom;

the upper layer has an average thickness of from 1.5 μm or more to 15.0 μm or less; and the upper layer is an α-type aluminum oxide layer comprised of α-type aluminum oxide.

19. The coated cutting tool according to claim 3, wherein:

the coating layer comprises a lower layer and an upper layer formed on a surface of the lower layer in order from the cemented carbide side;

the lower layer has an average thickness of from 1.5 μm or more to 15.0 μm or less;

the lower layer is a Ti compound layer comprised of a layer of one kind selected from the group consisting of a Ti carbide layer, a Ti nitride layer, a Ti carbonitride layer, a Ti carboxide layer and a Ti carboxynitride layer, or comprised of layers of two or more kinds selected therefrom;

the upper layer has an average thickness of from 1.5 μm or more to 15.0 μm or less; and the upper layer is an α-type aluminum oxide layer comprised of α-type aluminum oxide.

20. The coated cutting tool according to claim 4, wherein:

the coating layer comprises a lower layer and an upper layer formed on a surface of the lower layer in order from the cemented carbide side;

the lower layer has an average thickness of from 1.5 μm or more to 15.0 μm or less;

the lower layer is a Ti compound layer comprised of a layer of one kind selected from the group consisting of a Ti carbide layer, a Ti nitride layer, a Ti carbonitride layer, a Ti carboxide layer and a Ti carboxynitride layer, or comprised of layers of two or more kinds selected therefrom;

the upper layer has an average thickness of from 1.5 μm or more to 15.0 μm or less; and the upper layer is an α-type aluminum oxide layer comprised of α-type aluminum oxide.

* * * * *